United States Patent
Murata

(10) Patent No.: US 6,594,179 B2
(45) Date of Patent: Jul. 15, 2003

(54) FLOATING GATE TYPE NONVOLATILE SEMICONDUCTOR MEMORY

(75) Inventor: Nobukazu Murata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/106,035

(22) Filed: Mar. 27, 2002

(65) Prior Publication Data

US 2003/0053337 A1 Mar. 20, 2003

(30) Foreign Application Priority Data

Sep. 14, 2001 (JP) ........................................ 2001-279347

(51) Int. Cl.[7] .............................................. G11C 16/04
(52) U.S. Cl. ............................ 365/185.18; 365/189.02; 365/189.09; 365/203
(58) Field of Search ........................ 365/185.18, 189.02, 365/189.09, 203, 230.02, 230.04, 189.01, 185.26

(56) References Cited

U.S. PATENT DOCUMENTS 6,343,031 B1 * 1/2002 Murata ........................ 365/104

* cited by examiner

Primary Examiner—David Lam
(74) Attorney, Agent, or Firm—Volentine Francos, PLLC

(57) ABSTRACT

In a floating gate type nonvolatile semiconductor memory having a memory cell array constituted of a plurality of memory cells arrayed in a matrix pattern, word lines and bit lines, with the word lines connected to a row of gate electrodes of memory cells with one cell drain voltage exclusively connected to drain electrodes of either even-numbered memory cells or odd-numbered memory cells among the memory cells through select lines in units of individual rows, another cell drain voltage is connected to the bit lines sequentially via a data write circuit and a multiplexer circuit, the bit lines are each connected to a row of source electrodes of the memory cells and at least two sets each constituted of an data write circuit and a multiplexer circuit are provided with at least one set connected to the ends of the plurality of bit lines on each side.

20 Claims, 9 Drawing Sheets

FLOATING GATE TYPE NONVOLATILE SEMICONDUCTOR MEMORY

BACKGROUND OF THE INVENTION

1. Field of the Invention

The present invention relates to a floating gate type nonvolatile semiconductor memory achieving an improvement in a data write circuit.

2. Description of the Related Art

A floating gate type nonvolatile semiconductor memory assumes a structure achieved by two-dimensionally arraying memory cells each having a control gate electrode and a floating gate electrode embedded in an insulating film laminated one on top of the other. A floating gate type nonvolatile semiconductor memory is used in application as various types of read only memory (ROM) that allow an overwrite.

A floating gate type nonvolatile semiconductor memory in the related art adopts the following structure. A memory cell array is constituted of a plurality of memory cells (MC0, MC1, . . . ) provided in a matrix pattern, a plurality of bit lines (BL0, BL1, . . . ) and a plurality of word lines (WL0, WL1, . . . ) each connected to the individual memory cells. The plurality of word lines are each connected to rows of gate electrodes of the memory cells.

A cell drain voltage source supplies a voltage to be applied to the drain electrode of each of the memory cells (MC0, MC1, . . . ). A "PGMYB" signal and a "RST" signal which are to be detailed later are input to the cell drain voltage source. In this specification and the attached drawings, the voltage supply terminal at the cell drain voltage source and the voltage supplied through the voltage supply terminal are both referred to as "CDV", unless otherwise specified.

One CDV supplied from the cell drain voltage source is exclusively connected to the drain electrodes of even-numbered memory cells or odd-numbered memory cells among the memory cells (MC0, MC1, . . . ) through a plurality of select lines (SL0, SL1 . . . ) in units of individual rows. Another CDV supplied from the cell drain voltage source is connected to the plurality of bit lines (BL0, BL1, . . . ) sequentially via a data write circuit and a multiplexer circuit. The bit lines (BL0, BL1, . . . ) are each connected to one row of source electrodes of the memory cells (MC0, MC1, . . . ).

The data write circuit is employed to write "0" data or "1" data into each memory cell. In addition to the CDV, the "PGMYB" and "RST" signals to be detailed later and the "0" data or the "1" data are input to the data write circuit.

The multiplexer circuit selects a given bit line through which the voltage from the cell drain voltage source is to be supplied and connects the cell drain voltage source to the selected bit line.

Hereafter, "L" indicates the "ground level" and "H" indicates the "source voltage level" in the specification and the attached drawings unless otherwise specified.

The "PGMYB" signal input to the cell drain voltage source and the data write circuit shifts to "L" during a write operation. In addition, the "RST" signal input to the cell drain voltage source and the data write circuit is set to "H" level over a specific period when the "PGMYB" signal shifts from "L" to "H". The specific length of time over which the "RST" is sustained at "H" level is set to a length of time that is long enough for the voltage at the bit line charged through the write operation to come down to the ground level. A "BLPZA" indicates a node that connects the data write circuit with the multiplexer circuit.

During the write operation, the cell drain voltage source supplies a write voltage, e.g., 4.5V, if "L" is input to a "PGMYB" which is controlled by the "PGMYB" signal. If, on the other hand, "H" is input to the "PGMYB", a read voltage, e.g., 1.0V, is supplied. In addition, the voltage supply from the cell drain voltage source is suspended while the "RST" signal is at "H", thereby setting the CDV to the ground level. A low through rate is set for the write voltage (CDV) in order to prevent a write error.

When writing the "0" data, electrons are injected into the floating gate by applying the 4.5V voltage between the drain electrode and the source electrode at the memory cell. However, if the voltage applied between the drain electrode and the source electrode of the memory cell is equal to or lower than 1.5V, no electrons are injected into the floating gate and the "1" data are written. While "0" indicates the state in which a electrons are injected in the following description, it goes without saying that the "0" and "1" settings may be reversed.

Now, a data write operation performed at the MC0 is explained. The write operation is performed by inputting "L" to the "PGMYB" and applying the 4.5V voltage to the drain electrode of the MC0. The multiplexer circuit connects the BL0 "BLPZA".

When writing the "1" data, the data write circuit raises the voltage at the "BLPZA" in conformance to the CDV until the voltage is ultimately biased to 3V. As a result, 1.5V is applied between the drain electrode and the source electrode at the MC0 and no electrons are injected into the floating gate.

When writing the "0" data on the other hand, the data write circuit sets the "BLPZA" to the ground level "L". Consequently, a 4.5V voltage is applied between the drain electrode and the source electrode at the MC0, thereby allowing electrons to be injected into the floating gate of the MC0.

During the write operation, the "data write cycle" and the "verify cycle" in which the data that have been written are verified are alternately repeated. When the operation shifts from the data write cycle to the verify cycle, the "PGMYB" signal shifts from "L" to "H", thereby setting the "RST" signal to "H" over the specific length of time. When the "RST" signal is set to "H", the data write circuit connects the "BLPZA" to the CDV. Thus, as the CDV shifts to the ground level "L", the "BLPZA", too, shifts to the ground level "L". The data write operation is performed as described above.

As further miniaturization is pursued in semiconductor processes in recent years, the unit length resistance at a bit line has been increasing. This tendency is particularly prominent in a memory with a larger capacity. Since the bit line current generated during a data write operation is significant, the extent to which the voltage becomes lowered through the bit line becomes further pronounced. For this reason, even when the BLPZA is grounded, the voltage is allowed to float by the degree corresponding to the bit line resistance from the ground level at a bit line end distanced from the BLPZA. When this happens, the required level of a voltage is not applied to the drain and the source of the memory cell and, in addition, the difference in the potential between the gate electrode and the source electrode becomes reduced. Thus, a problem arises in that an incomplete write occurs, thereby inducing a write error.

SUMMARY OF THE INVENTION

Accordingly, an object of the present invention is to provide a floating gate type nonvolatile semiconductor memory that allows a reliable data write and reduces the occurrence of a write error even in a large-capacity memory manufactured through a semiconductor process pursuing further miniaturization by making an improvement on the bit line settings in the related art.

In order to achieve the object described above, in the floating gate type nonvolatile semiconductor memory according to the present invention having a memory cell array constituted of a plurality of memory cells arrayed in a matrix pattern, a plurality of bit lines and a plurality of word lines each connected to the individual memory cells, the plurality of word lines are connected to a row of gate electrodes of memory cells with one voltage supplied from a cell drain voltage source exclusively connected to drain electrodes of even-numbered memory cells or odd-numbered memory cells through a plurality of select lines in units of individual rows, another voltage supplied from the cell drain voltage source is connected to the plurality of bit lines sequentially via a data write circuit and a multiplexer circuit, the bit lines are each connected to a row source electrodes of the memory cells in units of individual rows and at least two sets each constituted of a data write circuit and a multiplexer circuit are provided with at least one set connected to the two ends of the plurality of bit lines on each side.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1:
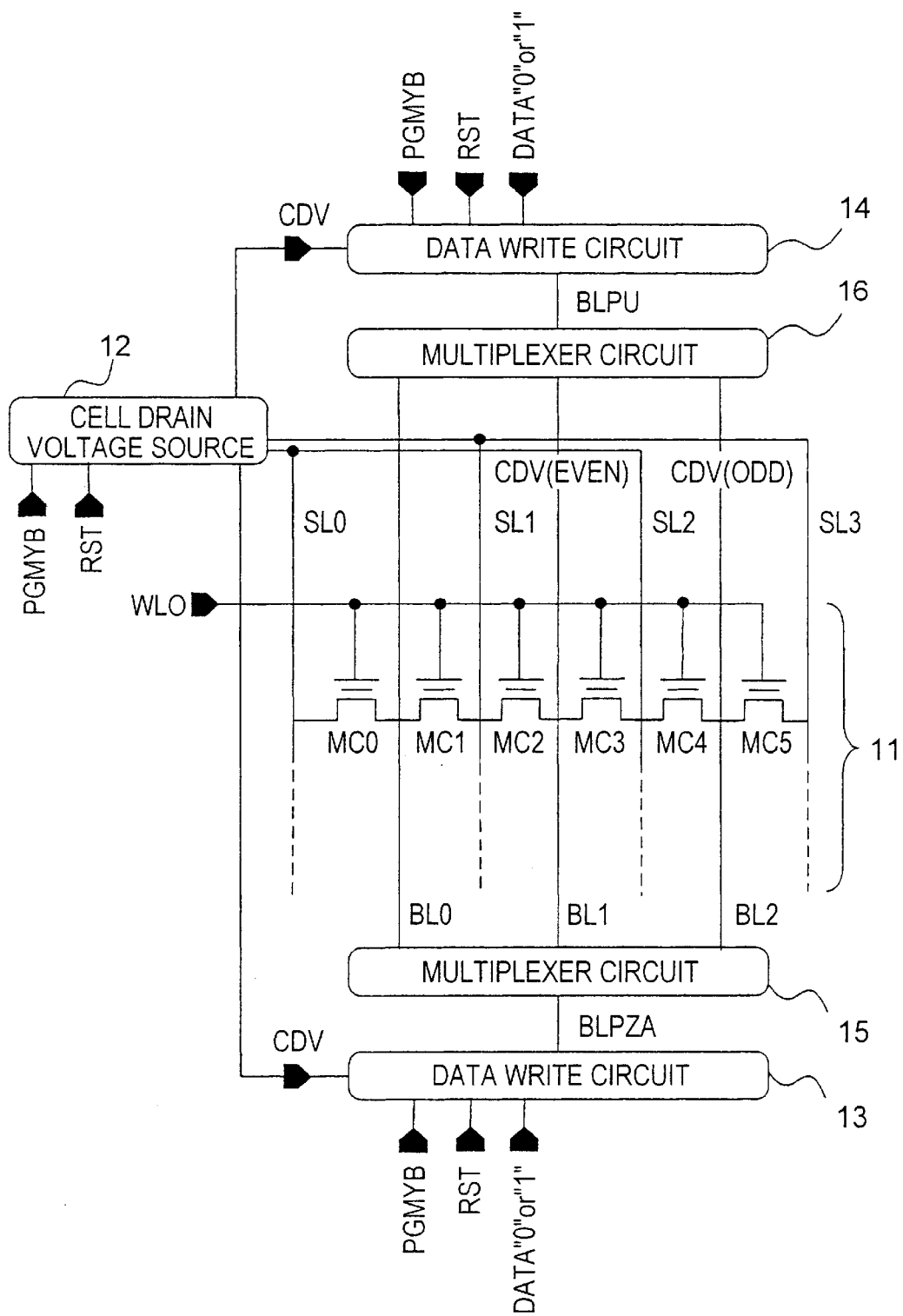
FIG. 1 shows a block diagram of the floating gate type nonvolatile semiconductor memory achieved in a first embodiment.

The following is an explanation of several embodiments of the present invention, given in reference to the drawings. It is to be noted that the same reference numerals are assigned to components having essentially identical functions and structural features in the specification and the drawings to preclude the necessity for a repeated explanation thereof.

(First Embodiment)

FIG. 1 shows the structure assumed in the floating gate type nonvolatile semiconductor memory achieved in the first embodiment of the present invention. FIG. 1 only shows a single row of word line, i.e., WL0, and does not include the illustration of the remaining word lines. In addition, it only shows three the lines, BL0, BL1 and BL2 and the illustration of the remaining bit lines is omitted. It also shows six memory cells, MC0, MC1, . . . MC5 only and does not include the illustration of the remaining memory cells.

At the MC0, the MC2 and the MC4 in FIG. 1, the gate electrode, the drain electrode and the source electrode are provided at the top, at the left and at the right respectively, and the positions of the drain electrode and the source electrode are reversed at the MC1, the MC3 and the MC5. In addition, only four select lines, SL0, SL1, SL2 and SL3, are shown with the illustration of the other select lines omitted.

As shown in FIG. 1, the memory cell array 11 is constituted of a plurality of memory cells (MC0, MC1, . . . ) arrayed in a matrix pattern and a plurality of word lines (WL0, WL1, . . . ) and a plurality of bit lines (BL0, BL1, . . . ) connected to one of the memory cells (MC0, MC1, . . . ), with the plurality of word lines (WL0, WL1, . . . ) each connected to the individual rows of the gate electrodes at the memory cells.

A cell drain voltage source 12 supplies a voltage to be applied to the drain electrode of each of the memory cells (MC0, MC1, . . . ). The voltage supplied from the cell drain voltage source 12 is exclusively connected to the drain electrodes of either the even-numbered memory cells or the odd-numbered memory cells among the memory cells (MC0, MC1, . . . ) through a plurality of select lines (SL0. SL1. . . . ) in units of individual rows. In addition, a "PGMYB" signal and an "RST" signal are input to the cell drain voltage source 12.

Data write circuits and multiplexer circuits provided so as to constitute at least two sets respectively comprising a data write circuit 13 and a multiplexer circuit 15 and a data write circuit 14 and a multiplexer circuit 16. FIG. 1 presents an example in which two such sets are provided.

The data write circuit 13 and the data write circuit 14 having identical functions are provided to write "0" data or "1" data into the individual memory cells. In addition to the CDV, the "PGMYB" signal the "RST" signal and the "0" or the "1" data are input to the data write circuit 13 and the data write circuit 14.

The multiplexer circuit 15 and the multiplexer circuit 16, which have identical functions, each select a given bit line through which the voltage from the cell drain voltage source 12 is to be supplied and connect the selected bit line.

The voltage supplied from the cell drain voltage source 12 is also connected to one end of each of the plurality of bit lines (BL0, BL1, ...) sequentially via the data write circuit 13 and the multiplexer circuit 15 and is also connected to the other ends of the plurality of bit lines (BL0, BL1, ...) sequentially via the data write circuit 14 and the multiplexer circuit 16, with the bit lines (BL0, BL1, ...) each connected to a row of source electrodes of the memory cells (MC0, MC1, ...).

The "PGMYB" signal input to the cell drain voltage source 12 and the data write circuits 13 and 14 shift to "L" during a write operation. The "RST" signal input to the cell drain voltage source 12 and the data write circuits 13 and 14 is set to "H" over a specific length of time when the "PGMYB" signal shifts from "L" to "H". The length of time over which the "RST" signal is sustained at "H" is set long enough for the voltage at the bit line charged through the write operation to become lowered to the ground level. "BLPZA" and "BLPU" indicate nodes respectively connecting the data write circuit 13 to the multiplexer circuit 15 and the data write circuit 14 to the multiplexer circuit 16.

During the write operation, the cell drain voltage source 12 supplies a write voltage, e.g., 4.5V, if "L" is input to a "PGMYB" which is controlled by the "PGMYB" signal. If, on the other hand, "H" is input to the "PGMYB", a read voltage, e.g., 1.0V, is supplied. In addition, the voltage supply from the cell drain voltage source 12 is suspended while the "RST" signal is at "H", thereby setting the CDV to the ground level. A low through rate is set for the write voltage (CDV) in order to prevent a write error.

When writing the "0" data, electrons are injected into the floating gate by applying the 4.5V voltage between the drain electrode and the source electrode at the memory cell. However, if the voltage applied between the drain electrode and the source electrode of the memory cell is equal to or lower than 1.5V, no electrons are injected into the floating gate and the "1" data are written.

Figure 2A:
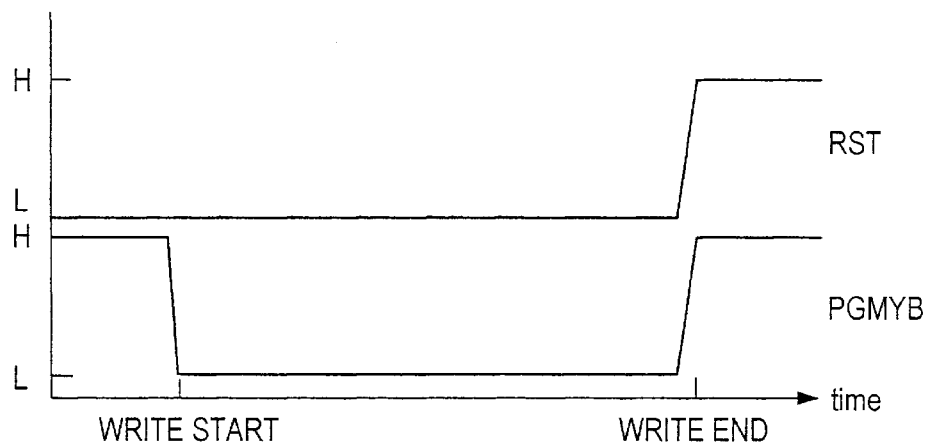
FIG. 2(a) presents at timing chart of the data write operation performed in the floating gate type nonvolatile semiconductor memory in the first embodiment and FIG. 2(b) presents a chart of the change occurring in the voltage between the drain electrode and the source electrode as the data write operation progresses.
Figure 2B:
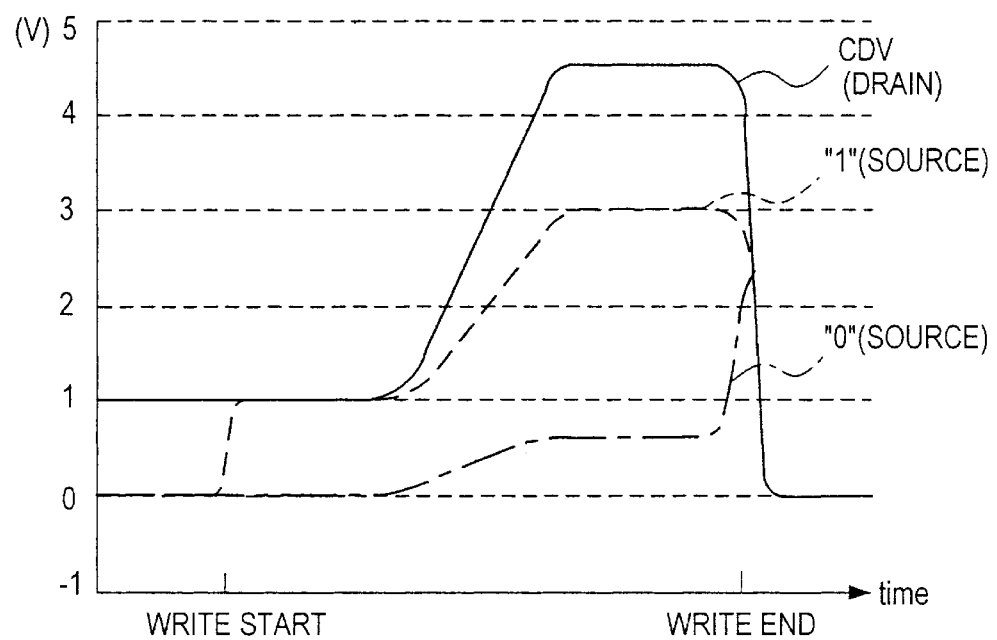

FIG. 2(a) presents a timing chart of the data write operation performed in the floating gate type nonvolatile semiconductor memory in the first embodiment assuming the structure shown in FIG. 1. In addition, FIG. 2(b) shows changes in the potentials in correspondence to the timing chart in FIG. 2(a), with the solid line at the top representing the change occurring in the CDV (V), i.e., the drain electrode potential (V), the dotted line representing the change occurring in the source electrode potential (V) during a "1" data write and the one-point chain line representing the change occurring in the source electrode potential (V) occurring during the "0" data write. By referring to FIG. 2(b), the change occurring in the voltage between the drain electrode and the source electrode can be ascertained.

Now, in reference to FIG. 2, an operation performed to write data into the MC0 in FIG. 1 is explained.

For the write operation, "L" is input to the "PGMYB" and a 4.5 V voltage is applied to the drain electrode of the MC0. The multiplexer circuits 15 and 16 connect the BL0 to the "BLPZA" and the "BLPU" respectively.

When writing the "1" data, the data write circuits 13 and 14 raise the voltages at the "BLPZA" and the "BLPU" in conformance to the CDV until the voltage is ultimately biased to 3V. As a result, 1.5V is applied between the drain electrode and the source electrode at the MC0 and no electrons are injected into the floating gate.

When writing the "0" on the other hand, the data write circuits 13 and 14 set the "BLPZA" and the "BLPU" to the ground level "L". Consequently, the two ends of the bit line become grounded and a 4.5V voltage is applied between the drain electrode and the source electrode at the MC0, thereby allowing electrons to be injected into the floating gate of the MC0.

During the write operation, the "data write cycle" and the "verify cycle" in which the data that have been written are verified are alternately repeated. When the operation shifts from the data write cycle to the verify cycle, the "PGMYB" shifts from "L" to "H", thereby setting the "RST" signal to "H" over the specific length of time. When the "RST" signal is set to "H", the data write circuits 13 and 14 connect the "BLPZA" and the "BLPU" to the CDV and thus, as the CDV shifts to the ground level "L" and the "BLPZA" and the "BLPU", too, shift to the ground level "L". The data write operation is performed as described above.

As explained above, since a set of a data write circuit and a multiplexer circuit is provided at each end of the bit line in the first embodiment, the grounding capability of the bit line during the "0" data write operation improves over that achieved in the structure of the related art and, as a result, a more reliable "0" data write is achieved without allowing the difference in the potential between the gate and the source to become reduced due to the bit line resistance.

(Second Embodiment)

Figure 3:
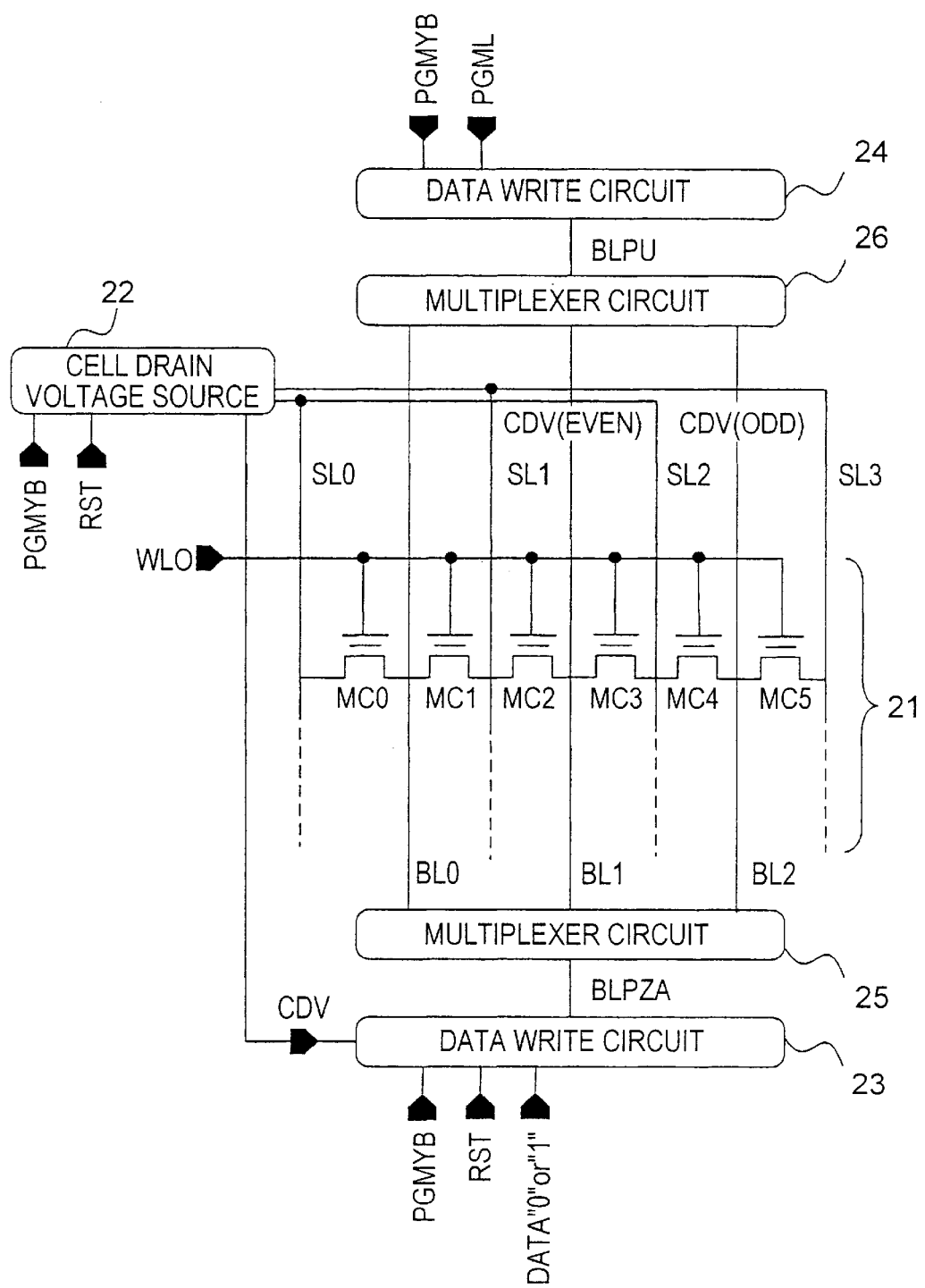
FIG. 3 shows a block diagram of the floating gate type nonvolatile semiconductor memory achieved in a second embodiment.

FIG. 3 shows the structure assumed in the floating gate type nonvolatile semiconductor memory achieved in the second embodiment of the present invention. Since WL0, BL0, BL1, BL2, MC0, MC1, MC2, ..., MC5, SL0, SL1, SL2 and SL3 in FIG. 3 assume structures identical to those in the first embodiment (see FIG. 1), their explanation is omitted.

As shown in FIG. 3, a virtual grounding type memory cell array 21 comprises a plurality of word lines (WL0, WL1, ...), a plurality of bit lines (BL0, BL1, ...) and a plurality of memory cells (MC0, MC1, ...) arrayed in a matrix pattern, with the plurality of word lines (WL0, WL1, ...) each connected to a row of gate electrodes of the memory cells (MC0, MC1, ...).

A cell drain voltage source 22 supplies a voltage to be applied to the drain electrode of each of the memory cells (MC0, MC1, ...). The voltage supplied from the cell drain voltage source 22 is exclusively connected to the drain electrodes of either the even-numbered memory cells or the odd-numbered memory cells among the individual memory cells (MC0, MC1, ...) through a plurality of select lines (SL0. SL1 ...) in units of individual rows. In addition, a "PGMYB" signal and an "RST" signal are input to the cell drain voltage source 22.

A data write circuit 23 and a data write circuit 24 write "0" data or "1" data into the individual memory cells. In addition to the CDV, the "PGMYB" signal, the "RST" signal and the "0" data or the "1" data are input to the data write circuit 23, whereas the CDV is not input to the data write circuit 24 to which the "PGMYB" signal and a "PGML" signal to be detailed later are input.

A first multiplexer circuit 25 and a second multiplexer circuit 26, which have identical functions, each select a given bit line through which the voltage from the cell drain voltage source 22 is to be supplied and connect the selected bit line.

The voltage supplied from the cell drain voltage source 22 is also connected to one end of each of the plurality of the bit lines (BL0, BL1, ...) sequentially via the data write circuit 23 and the multiplexer circuit 25.

The data write circuit 24, which is not supplied with any voltage from the cell drain voltage source 22, is connected to the other ends of the plurality of bit lines (BL0, BL1, ...)

via the multiplexer circuit 26. The bit lines (BL0, BL1, . . . ) are each connected to a row of source electrodes of the memory cells (MC0, MC1, . . . ).

The "PGMYB" signal input to the cell drain voltage source 22 and the data write circuits 23 and 24 shifts to "L" during a write operation. In addition, the "PGML" signal input to the data write circuit 24 outputs an "L" active one-shot pulse when a specific length of time elapses after "L" is input to the "PGMYB", the "RST" signal input to the cell drain voltage source 22 and the data write circuit 23 is set to "H" over a specific length of time when the "PGMYB" signal shifts from "L" to "H". The length of time over which the "RST" signal is sustained at "H" is set long enough for the voltage at the bit line charged through the write operation to fall to the ground level. "BLPZA" and "BLPU" indicate nodes respectively connecting the data write circuit 23 to the first multiplexer circuit 25 and the data write circuit 24 to the second multiplexer circuit 26.

During the write operation, the cell drain voltage source 22 supplies a write voltage, e.g., 4.5V, if "L" is input to the "PGMYB" which is controlled by the "PGMYB" signal. If, on the other hand, "H" is input to the "PGMYB", a read voltage, e.g., 1.0V, is supplied. In addition, the voltage supply from the cell drain voltage source 22 is suspended while the "RST" signal is at "H", thereby setting the CDV to the ground level. A low through rate is set for the write voltage (CDV) in order to prevent a write error.

When writing the "0" data, electrons are injected into the floating gate by applying the 4.5V voltage between the drain electrode and the source electrode at the memory cell. However, if the voltage applied between the drain electrode and the source electrode of the memory cell is equal to or lower than 1.5V, no electrons are injected into the floating gate and the "1" data are written.

Figure 4A:
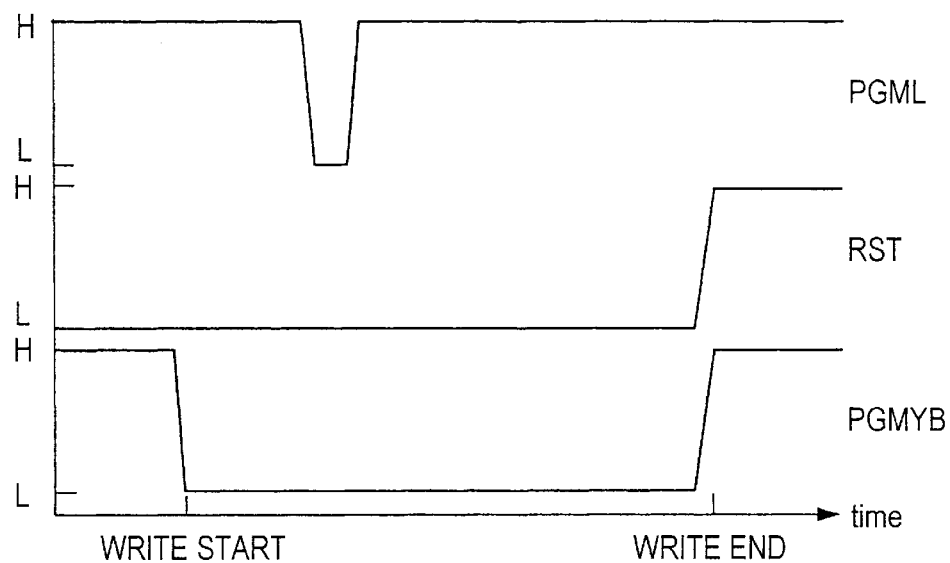
FIG. 4(a) presents at timing chart of the data write operation performed at the floating gate type nonvolatile semiconductor memory in the second embodiment and FIG. 4(b) presents a chart of the change occurring in the voltage between the drain electrode and the source electrode as the data write operation progresses.
Figure 4B:
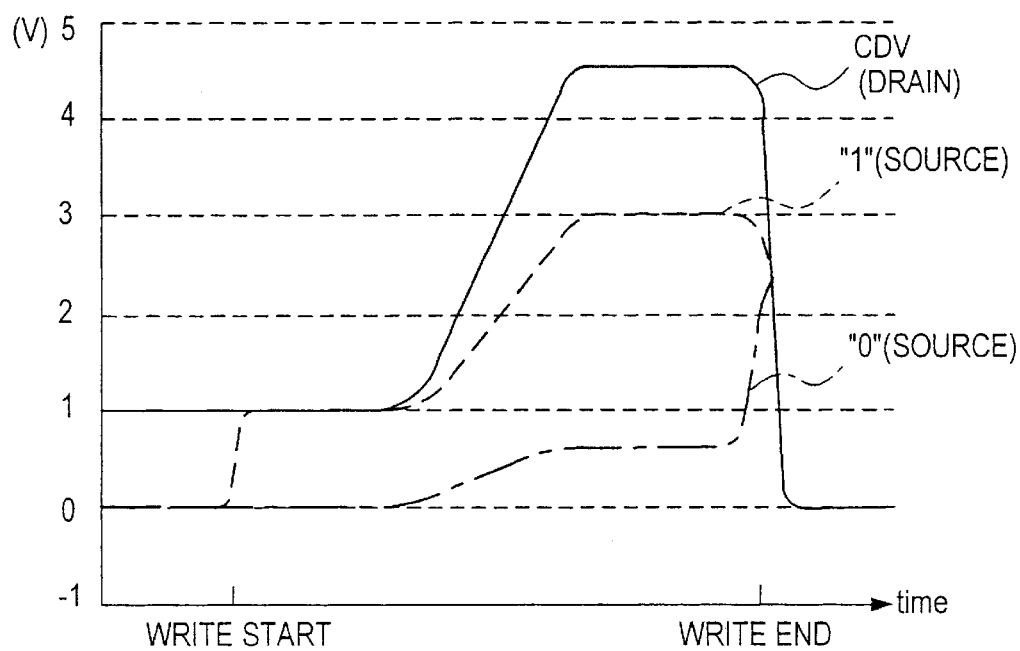

FIG. 4(*a*) presents a timing chart of the data write operation performed in the floating gate type nonvolatile semiconductor memory in the second embodiment assuming the structure shown in FIG. 3. In addition, FIG. 4(*b*) shows changes in the potentials in correspondence to the timing chart in FIG. 4(*a*), with the solid line at the top representing the change occurring in the CDV (V), i.e., the drain electrode potential (V), the dotted line representing the change occurring in the source electrode potential (V) during the "1" data write and the one-point chain line representing the change occurring in the source electrode potential (V) during the "0" data write.

Now, in reference to FIG. 4, an operation performed to write data into the MC0 in FIG. 3 is explained.

For the write operation, "L" is input to the "PGMYB" and a 4.5 V voltage is applied to the drain electrode of the MC0. The multiplexer circuits 25 and 26 connect the BL0 to the "BLPZA" and the "BLPU" respectively.

When writing the "1" data, the data write circuit 23 raises the voltage at the "BLPZA" in conformance to the CDV until the voltage is ultimately biased to 3V. In addition, the data write circuit 24 makes a decision as to whether the "0" data or the "1" data are written based upon the voltage at the "BLPU" when the "PGML" signal has output a one-shot pulse. If it is decided that the "1" data are written, the "BLPU" becomes opened (not grounded). As a result, 1.5V is applied between the drain electrode and the source electrode at the MC0, and no electrons are injected into the floating gate.

When writing the "0" data on the other hand, the data write circuit 23 sets the "BLPZA" to the ground level "L". In addition, the data write circuit 24 makes a decision as to whether the "0" data or the "1" data are written based upon the voltage at the "BLPU" when the "PGML" signal has output a one-shot pulse. If it is decided that the "0" data are written, the "BLPU" becomes grounded. Consequently, the two ends of the bit line become grounded and a 4.5V voltage is applied between the drain electrode and the source electrode at the MC0, thereby allowing electrons to be injected into the floating gate of the MC0.

During the write operation, the "data write cycle" and the "verify cycle" in which the data that have been written are verified are alternately repeated. When the operation shifts from the data write cycle to the verify cycle, the "PGMYB" shifts from "L" to "H", thereby setting the "RST" signal to "H" over the specific length of time. When the "RST" signal is set to "H", the data write circuits 23 connect the "BLPZA" (and the "BLPU") to the CDV and thus, as the CDV shifts to the ground level "L", the "BLPZA" and the "BLPU", too, shift to the ground level "L". The data write operation is performed a as described above.

As explained above, since a set of a data write circuit and a multiplexer circuit is provided at each end of the bit line in the second embodiment, the grounding capability of the bit line during the "0" data write operation improves over that achieved in the structure of the related art and, as a result, a more reliable "0" data write is achieved without allowing the difference in the potential between the gate electrode and the source electrode to become reduced due to the bit line resistance, as in the first embodiment.

In addition, while it is necessary to transmit the "0" or "1" input data to be written into the memory cell to the data write circuits provided at both ends of the bit line in the first embodiment, the second data write circuit 24 in the second embodiment does not require such data transmission. As a result, the wiring of the signal lines is simplified to enable more compact and more flexible layout design.

(Example of Data Write Circuit that May be Adopted in the Second Embodiment)

Figure 5:
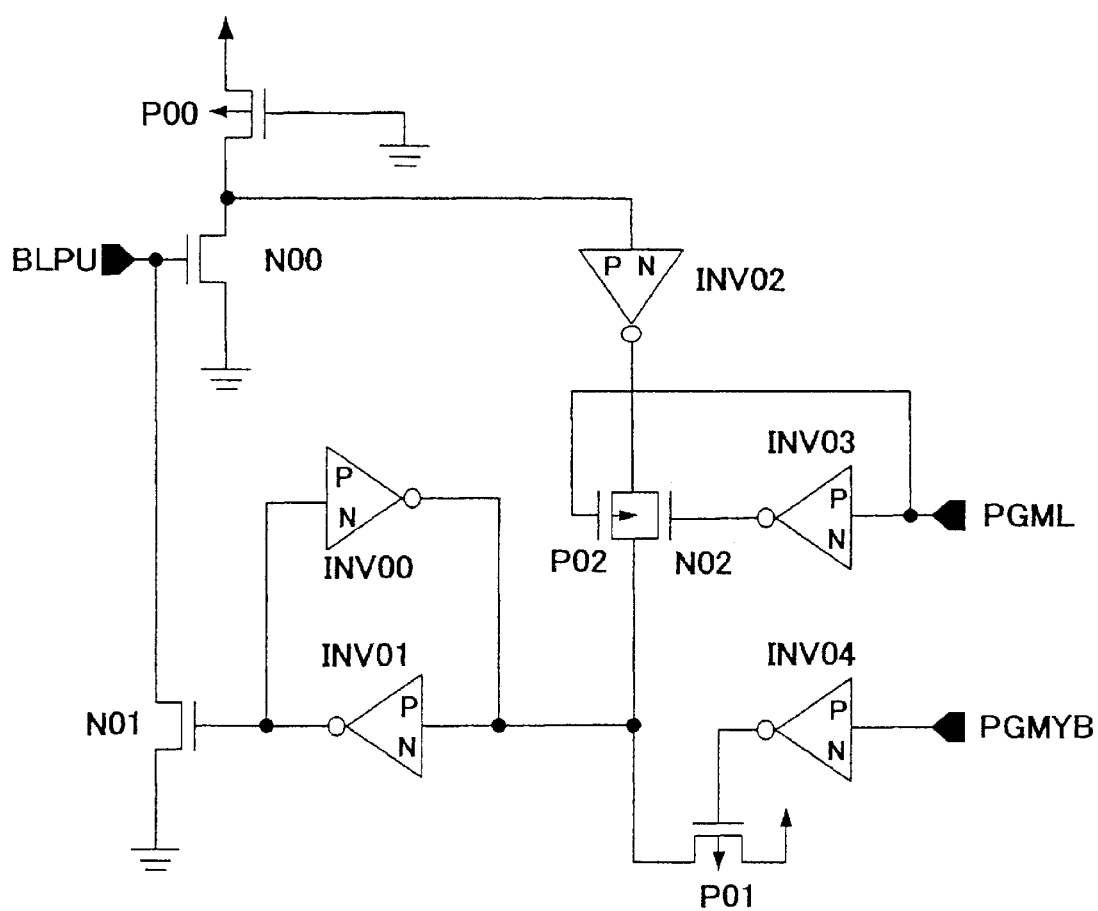
FIG. 5 presents an example of the data write circuit that may be adopted in the second embodiment.

FIG. 5 presents an example of the structure that may be assumed in the data write circuit 24 in the second embodiment. Since the "BLPU", the "PGMYB" and the "PGML" in FIG. 5 are identical to those explained earlier, their explanation is omitted.

In FIG. 5, INV00, INV01, . . . INV04 each indicate an invertor, N00, N01 and N02 each indicate an N-channel MOS transistor (hereafter referred to as an "NMOS") and P00, P01 and P02 each indicate a P channel MOS transistor (hereafter referred to as a "PMOS").

The BLPU is input to the gate electrode of N00, whereas the source electrode of N00 is grounded and the drain electrode of N00 is connected to the drain electrode of P00. The source electrode of P00 is connected to a source voltage (hereafter referred to as a "VDD" (not shown)), with the gate electrode of P00 grounded. Through the connections described above, a BLPU invertor is formed by N00 and P00, with its output (the drain electrodes of N00 and P00) connected to the input terminal of INV02.

The output terminal of INV02 is connected to the source electrodes of N02 and P02. The PGML is input to the input terminal of INV03 and the output terminal of INV03 is connected to the gate electrode of N02. The PGML is input to the gate electrode of P02, and a transfer gate is constituted by N02 and P02. The output of the transfer gate (the drain electrodes of N02 and P02) is connected to the input terminal of INV01.

The input terminal of INV00 is connected to the output terminal of INV01 with the input terminal of INV01 connected to the output terminal of INV00, thereby forming a latch circuit constituted of INV00 and INV01. The output terminal of INV01 is connected to the gate electrode of N01.

The drain electrode of N01 is connected to the BLPU and the source electrode of N01 is grounded. The PGMYB is input to the input terminal of INV04 with the output terminal of INV04 connected to the gate electrode of P01. The source electrode of P01 is connected to the VDD and the drain electrode of P01 is connected to the input terminal of INV01.

While "H" is input to the PGMYB, P01 is electrically continuous, INV01 outputs to "L" and "L" is input to the gate electrode of N01. Consequently, since N01 it is not electrically continuous, the end of the BLPU connected to the drain electrode of N01 can be regarded as open (not grounded).

As shown in FIG. 4, a write operation starts with "L" input to the PGMYB, P01 exits the state of electrical continuity but INV01 continuously outputs "L" through the latch circuit. In addition, the BLPU is grounded during a "0" data write and the voltage at the BLPU is biased to 3V during a "1" data write as explained earlier. As a result, the grounded voltage or the biased voltage is input to the gate electrode of N00.

By adjusting N00 and P00 so as to invert their outputs in response to an input of a given voltage in order to make it possible to distinguish the grounded "0" data write from the biased "1" data write and inputting a one-shot pulse to the PGML with appropriate timing, a decision can be made as to whether the "0" data or the "1" data are written to achieve a latch.

When the "0" data are written, the latch circuit latches "H", thereby setting N01 in an electrically continuous state. When writing the "1" data, the latch circuit latches "L", allowing N01 to sustain the state of non-continuity. As a result, N01 becomes electrically continuous and the BLPU connected to the drain electrode becomes grounded in during the "0" data write. During the "1" data write, N01 is not electrically continuous and thus, the BLPU end toward the data write circuit C becomes open (not grounded).

The second embodiment may be implemented by adopting the example of the data write circuit explained above. However, it is simply an example and the present invention is not limited to the particulars of the example.

(Third Embodiment)

Figure 6:
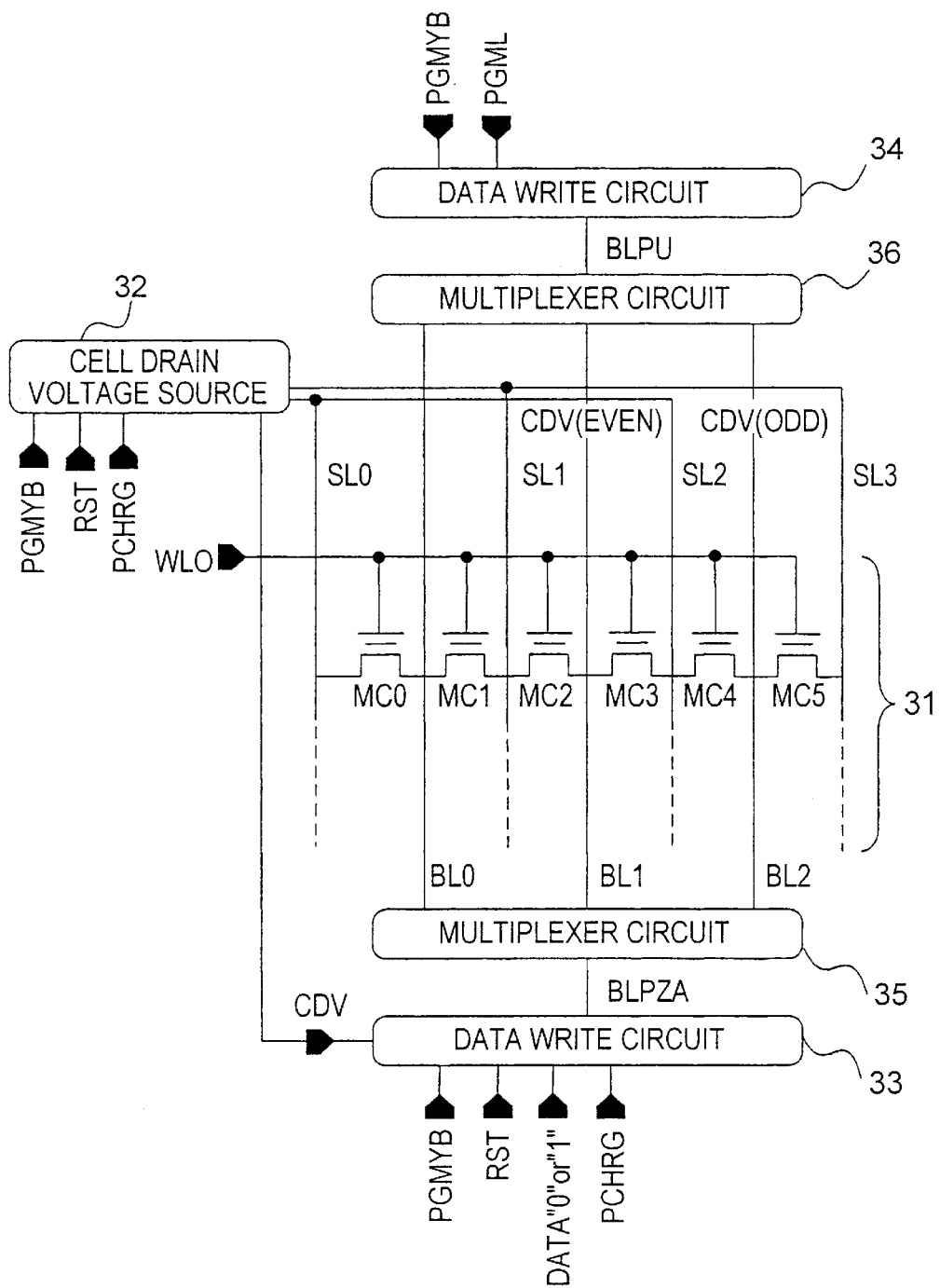
FIG. 6 shows a block diagram of the floating gate type nonvolatile semiconductor memory achieved in a third embodiment.

FIG. 6 shows the structure assumed in the floating gate type nonvolatile semiconductor memory achieved in the third embodiment of the present invention. Since WL0, BL0, BL1, BL2, MC0, MC1, MC2, ... MC5, SL0, SL1, SL2 and SL3 in FIG. 6 assume structures identical to those in the first embodiment (see FIG. 1), their explanation is omitted.

A precharge signal "PCHRG" as well as the CDV, the "PGMYB" signal, the "RST" and the "0" data or the "1" data is input to a data write circuit 33, and a precharge signal "PCHRG" is also input to a cell drain voltage source 32 in addition to the "PGMYB" signal and the "RST" signal.

The "PCHRG" signal remains at "H" level over a specific length of time as a write operation starts in response to a shift of the "PGMYB" from "H" to "L". The "PCHRG" signal is used to set the length of time over which a bit line is pre-charged. Namely, the bit line is pre-charged while the "PCHRG" signal is sustained at "H".

Since other structural features are identical to those in the second embodiment, their explanation is omitted.

Figure 7A:
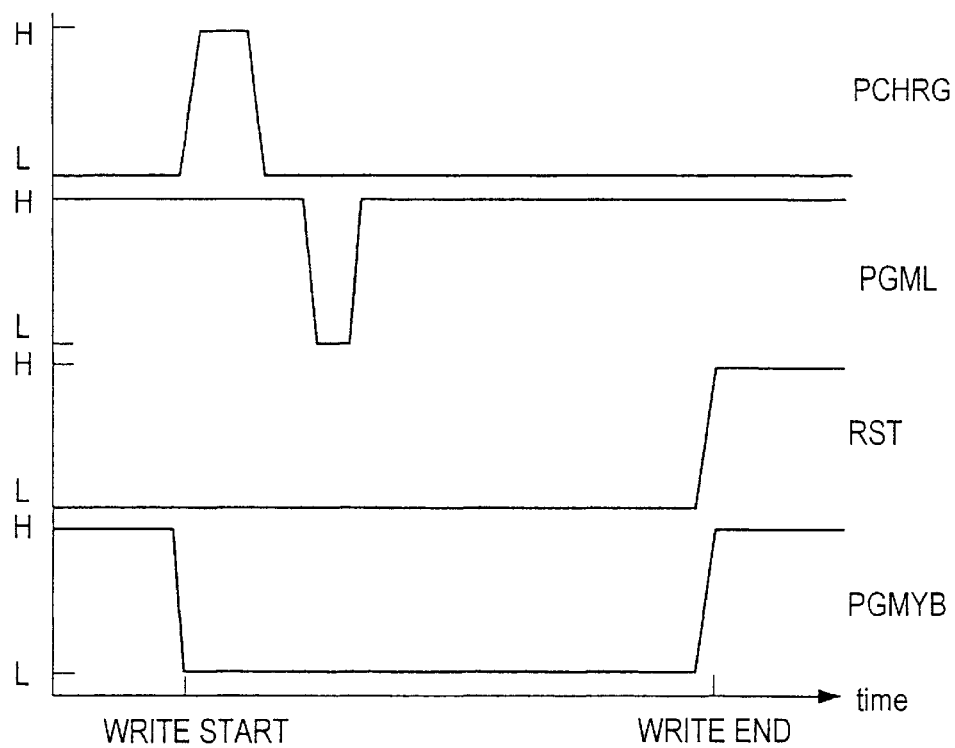
FIG. 7(a) presents at timing chart of the data write operation floating gate type nonvolatile semiconductor memory in the third embodiment and FIG. 7(b) presents a chart of the change occurring in the voltage between the drain electrode and the source electrode occur in as the data write operation progresses.
Figure 7B:
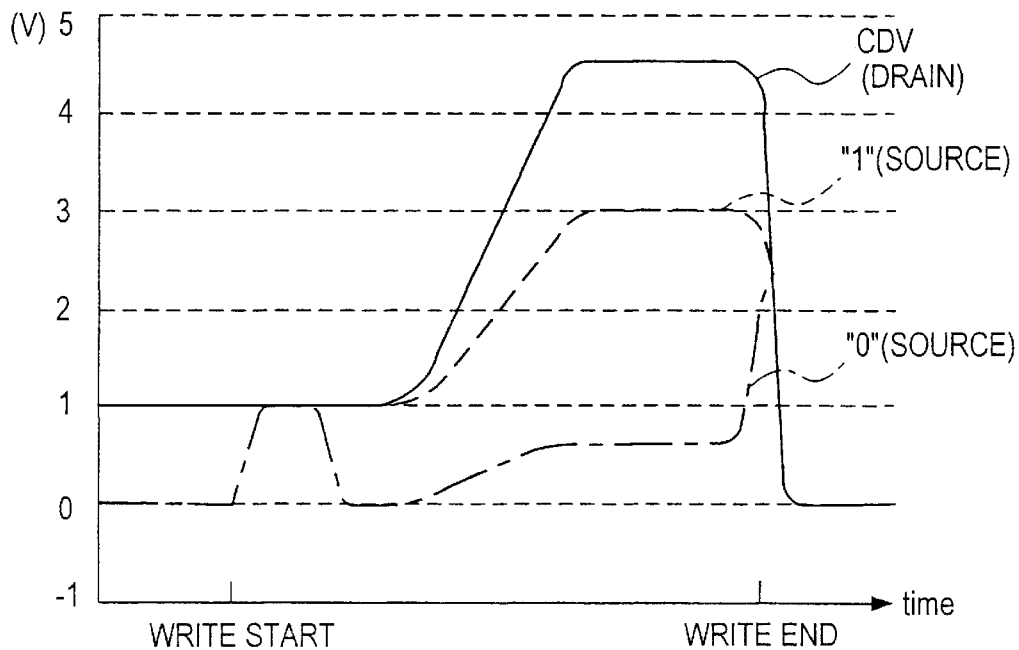

FIG. 7(a) presents a timing chart of the data write operation performed in the floating gate type nonvolatile semiconductor memory in the third embodiment assuming the structure shown in FIG. 6. In addition, FIG. 7(b) shows changes in the potentials in correspondence to the timing chart in FIG. 7(a), with the solid line at the top representing the change occurring in the CDV (V), i.e., the drain electrode potential (V), the dotted line representing the change occurring in the source electrode potential (V) during the "1" data write and the one-point chain line representing the change occurring in the source electrode potential (V) during the "0" data write.

An operation performed to write data into the MC0 in FIG. 6 is now explained in reference to FIG. 7. In this example, a data write circuit 34 assumes a circuit structure identical to that explained in reference to the second embodiment.

When "L" is input to the "PGMYB" to start the write operation, the "PCHRG" signal shifts to "H". The CDV outputs a voltage (hereafter referred to as the "precharge voltage") to be used to precharge the bit line while the "PCHRG" signal is sustained at "H". The precharge voltage should be set at an appropriate level and the CDV for data read, for instance, may be utilized as the precharge voltage, since the read CDV has a relatively high through rate and induces only an insignificant bit line resistance with its low voltage output of approximately 1.0V.

The data write circuit 33 connects "BLPZA" to the CDV while the "PCHRG" signal is sustained at "H". As a result, while the "PCHRG" signal is sustained at "H", the data write circuit 33 biases the voltage at the bit line to the pre-charge voltage regardless of the value of the data being written.

When the "PCHRG" signal shifts to "L", the data write circuit 33 grounds the BLPZA if the "0" data are written and biases the voltage to 3V if the "1" data are written. Subsequently, when the voltage at the bit line where the "0" data are written has become lowered to a sufficient extent, the "PGML" signal outputs a one-shot pulse to the data write circuit 34.

As a result, N01 at the data write circuit 34 becomes electrically continuous and the BLPU connected to the drain electrode becomes grounded during the "0" data write, as in the second embodiment. During the "1" data write, N01 at the data write circuit 34 is not electrically continuous and thus, the BLPU end toward the data write circuit 34 becomes open (not grounded).

As explained above, the third embodiment achieves advantages similar to those realized in the second embodiment.

In the circuit structure assumed in the second embodiment, in which the write voltage (CDV) has a low through rate setting in order to prevent a write error and the voltage at the BLPU is raised from the ground level because of an increase in the bit line current as the CDV nears 4.5V, it is difficult to achieve the right timing with which a latch is achieved by asserting the PGML. However, since a voltage source other than the write voltage (CDV), such as the read CDV, is used to precharge the bit line in the third embodiment, the ease of control is improved compared to the second embodiment, while the numbers of control signals and elements required in the structure adopted in the third embodiment are bound to be large.

(Fourth Embodiment)

Figure 8:
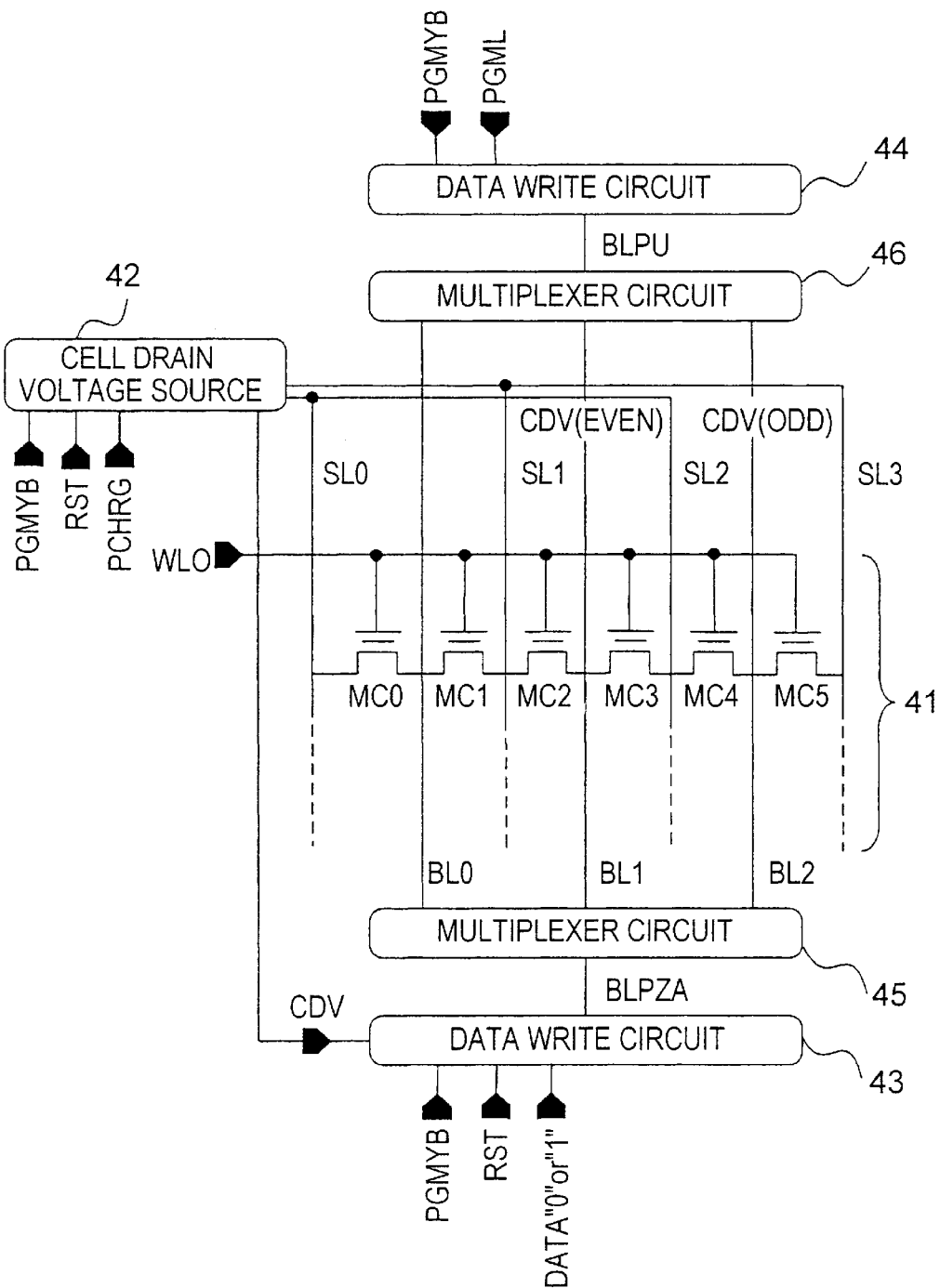
FIG. 8 shows a block diagram of the floating gate type nonvolatile semiconductor memory achieved in a fourth embodiment.

FIG. 8 shows the structure assumed in the floating gate type nonvolatile semiconductor memory achieved in the fourth embodiment of the present invention. Since WL0, BL0, BL1, BL2, MC0, MC1, MC2, ... , MC5, SL0, SL1, SL2 and SL3 in FIG. 8 assume structures identical to those in the first embodiment (see FIG. 1), their explanation is omitted.

As shown in FIG. 8, while the "PCHRG" signal is input to a cell drain voltage source 42 as in the third embodiment, the "PCHRG" signal is not input to a data write circuit 43 in the fourth embodiment. The "PCHRG" signal used in this embodiment is identical to that in the third embodiment. Since other structural features are identical to those in the second embodiment, their explanation is omitted.

Figure 9A:
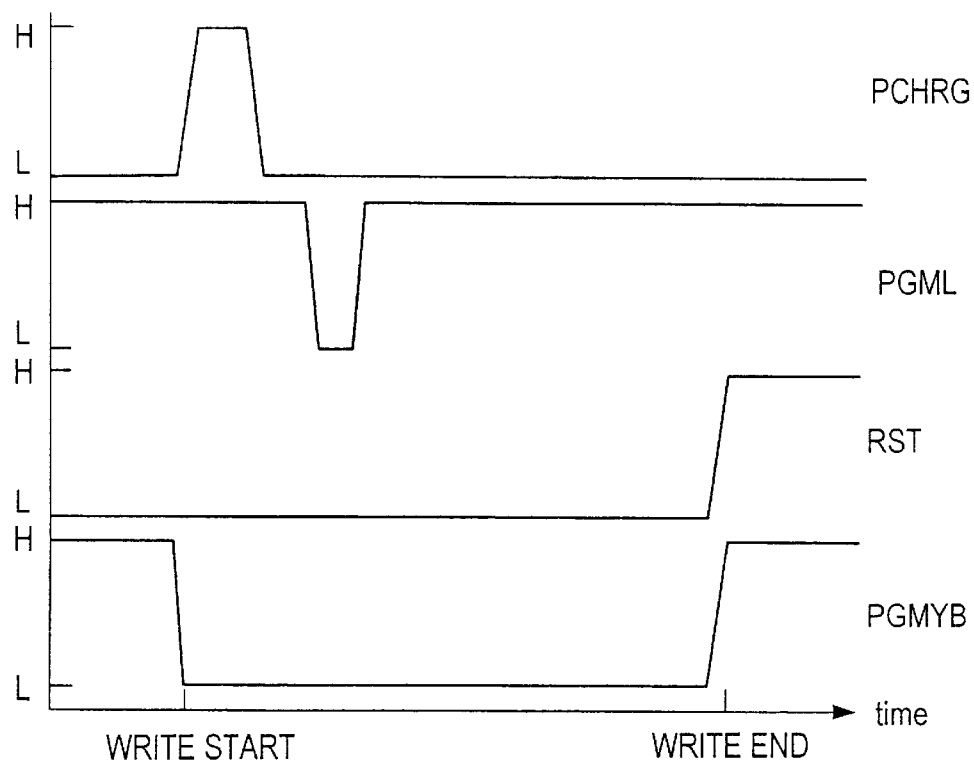
FIG. 9(a) presents at timing chart of the data write operation floating gate type nonvolatile semiconductor memory in the fourth embodiment and FIG. 9(b) presents a chart of the change occurring in the voltage between the drain electrode and the source electrode as the data write operation progresses.
Figure 9B:
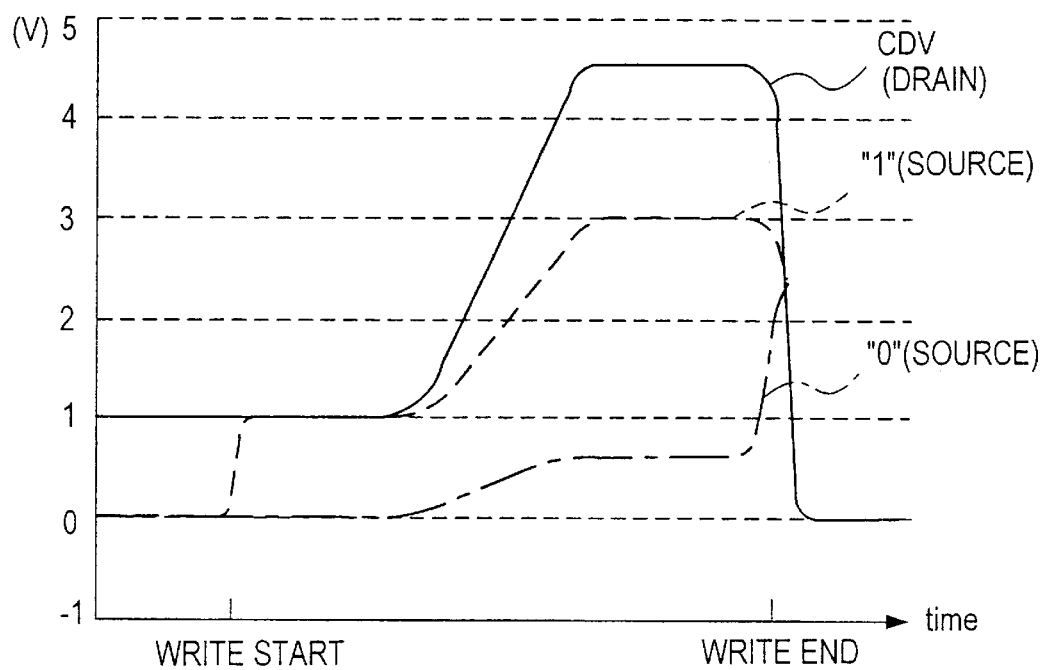

FIG. 9(a) presents a timing chart of the data write operation performed in the floating gate type nonvolatile semiconductor memory in the fourth embodiment assuming the structure shown in FIG. 8. In addition, FIG. 9(b) shows changes in the potentials in correspondence to the timing chart in FIG. 9(a), with the solid line at the top representing the change occurring in the CDV (V), i.e., the drain electrode potential (V), the dotted line representing the change occurring in the source electrode potential (V) during the "1" data write and the one-point chain line representing the change occurring in the source electrode potential (V) during the "0" data write.

An operation performed to write data into the MC0 in FIG. 8 is now explained in reference to FIG. 9. In this example, a data write circuit 44 assumes a circuit structure identical to that explained in reference to the second embodiment.

When "L" is input to the "PGMYB" terminal to start the write operation, the "PCHRG" signal shifts to "H". The CDV outputs a precharge voltage while the "PCHRG" signal is at "H". The precharge voltage should be set at an appropriate level and the CDV for data read, for instance, may be utilized as the precharge voltage for the reasons explained earlier.

As the write operation starts with the "PGMYB" signal shifting to "L", a data write circuit 43 outputs 3V to the BLPZA when writing the "1" data and sets the BLPZA to the ground level when writing the "0" data. When the "PCHRG" signal is set to "L", the "PGML" outputs a one-shot pulse to the data write circuit 44.

As a result, N01 at the data write circuit 44 becomes electrically continuous and the BLPU connected to the drain electrode becomes grounded during the "0" data write as in the third embodiment. During the "1" data write, N01 at the data write circuit 44 is not electrically continuous and thus, the BLPU end toward the data write circuit 44 becomes open (not grounded).

As explained above, the fourth embodiment achieves advantages similar to those realized in the second and third embodiments. In addition, by precharging only the bit line provided with the signal indicating the higher potential as a binary signal value, e.g., the bit line through which the "1" data are written, the need to input a precharge signal to the data write circuit 43 is eliminated, unlike in the third embodiment. This means that the signal line wiring is simplified to enable a more compact and more flexible layout design.

It goes without saying that the present invention as implemented in the first~fourth embodiments may be adopted in conjunction with any type of floating gate nonvolatile semiconductor device.

While the invention has been particularly shown and described with respect to preferred embodiments of the floating gate type nonvolatile semiconductor memory according to the present invention by referring to the attached drawings, the present invention is not limited to these examples and it will be understood by those skilled in the art that various changes in form and detail may be made therein without departing from the spirit, scope and teaching of the invention.

What is claimed is:

1. A floating gate type nonvolatile semiconductor memory having a memory cell array constituted of a plurality of memory cells arrayed in a matrix pattern, a plurality of word lines connected to said memory cells and a plurality of bit lines connected to said memory cells, wherein:

said plurality of word lines are each connected to a row of gate electrodes of said memory cells with one voltage supplied from a cell drain voltage source exclusively connected to drain electrodes of either even-numbered memory cells or odd-numbered memory cells among said memory cells through a plurality of select lines in units of individual rows;

another voltage supplied from said cell drain voltage source is connected to said plurality of bit lines sequentially via a data write circuit and a multiplexer circuit; and said bit lines are each connected to a row of source electrodes of said memory cells and at least two sets each constituted of a data write circuit and a multiplexer circuit are provided with at least one set connected to the ends of said plurality of bit lines on each side.

2. A floating gate type nonvolatile semiconductor memory according to claim 1, wherein:

the other voltage supplied from said cell drain voltage source is connected to said plurality of bit lines sequentially via said data write circuit and said multiplexer circuit in one set and is not connected to said data write circuit and said multiplexer in the other set.

3. A floating gate type nonvolatile semiconductor memory according to claim 1, wherein:

the other voltage supplied from said cell drain voltage source is connected to said plurality of bit lines sequentially via said data write circuit and said multiplexer circuit in one set and is not connected to said data write circuit and said multiplexer in the other set; and said data write circuit in said other set to which no voltage is supplied from said cell drain voltage source identifies a data value based upon the voltage at said plurality of bit lines so as to ground or not ground individual bit lines based upon said data values.

4. A floating gate type nonvolatile semiconductor memory according to claim 1, wherein:

the other voltage supplied from said cell drain voltage source is connected to said plurality of bit lines sequentially via said data write circuit and said multiplexer circuit in one set and is not connected to said data write circuit and said multiplexer in the other set, said data write circuit in said other set to which no voltage is supplied from said cell drain voltage source identifies a data value based upon the voltage at said plurality of bit lines so as to ground or not ground individual bit lines based upon said data values; and each bit line is precharged at a data write start.

5. A floating gate type nonvolatile semiconductor memory according to claim 1, wherein:

the other voltage supplied from said cell drain voltage source is connected to said plurality of bit lines sequentially via said data write circuit and said multiplexer circuit in one set and is not connected to said data write circuit and said multiplexer in the other set, said data write circuit in said other set to which no voltage is supplied from said cell drain voltage source identifies a data value based upon the voltage at said plurality of bit lines so as to ground or not ground individual bit lines based upon said data values; and each bit line is precharged at a data write start.

6. A floating gate type nonvolatile semiconductor memory according to claim 1, wherein:

said data write circuit in said other set to which no voltage is supplied from said cell drain voltage source identifies a data value based upon the voltage at said plurality of bit lines so as to ground or not ground individual bit lines based upon said data values; and a bit line provided with a signal indicating a higher potential as a binary signal value is precharged at a data write start.

7. A floating gate type nonvolatile semiconductor memory according to claim 1, wherein:

the other voltage supplied from said cell drain voltage source is connected to said plurality of bit lines sequentially via said data write circuit and said multiplexer circuit in one set and is not connected to said data write circuit and said multiplexer in the other set, said data write circuit in said other set to which no voltage is supplied from said cell drain voltage source identifies a data value based upon the voltage at said plurality of bit lines so as to ground or not ground individual bit lines based upon said data values; and a bit line provided with a signal indicating a higher potential as a binary signal value is precharged at a data write start.

8. A floating gate type nonvolatile semiconductor memory according to claim 1, wherein:

said data write circuit in said other set to which no voltage is supplied from said cell drain voltage source identifies a data value based upon the voltage at said plurality of bit lines so as to ground or not ground individual bit lines based upon said data values;

each bit line is precharged at a data write start; and said bit lines are precharged by using a voltage from a read cell drain voltage source.

9. A floating gate type nonvolatile semiconductor memory according to claim 1, wherein:

the other voltage supplied from said cell drain voltage source is connected to said plurality of bit lines sequentially via said data write circuit and said multiplexer circuit in one set and is not connected to said data write circuit and said multiplexer in the other set, said data write circuit in said other set to which no voltage is supplied from said cell drain voltage source identifies a data value based upon the voltage at said plurality of bit lines so as to ground or not ground individual bit lines based upon said data values; and each bit line is precharged at a data write start; and said bit lines are individually precharged by using a voltage from a read cell drain voltage source.

10. A floating gate type nonvolatile semiconductor memory according to claim 1, wherein:

said data write circuit in said other set to which no voltage is supplied from said cell drain voltage source identifies a data value based upon the voltage at said plurality of bit lines so as to ground or not ground individual bit lines based upon said data values;

a bit line provided with a signal indicating a higher potential as a binary signal value is precharged at a data write start; and said bit lines are precharged by using a voltage from a read cell drain voltage source.

11. A floating gate type nonvolatile semiconductor memory according to claim 1, wherein:

the other voltage supplied from said cell drain voltage source is connected to said plurality of bit lines sequentially via said data write circuit and said multiplexer circuit in one set and is not connected to said data write circuit and said multiplexer in the other set, said data write circuit in said other set to which no voltage is supplied from said cell drain voltage source identifies a data value based upon the voltage at said plurality of bit lines so as to ground or not ground individual bit lines based upon said data values;

a bit line provided with a signal indicating a higher potential as a binary signal value is precharged at a data write start; and said bit lines are precharged by using a voltage from a read cell drain voltage source.

12. A floating gate type nonvolatile semiconductor memory according to claim 1, wherein:

said memory cell array is a virtual grounding type memory cell array.

13. A floating gate type nonvolatile semiconductor memory according to claim 1, constituted of a stacked gate type transistor having a structure achieved by laminating floating gates and control electrodes.

14. A floating gate type nonvolatile semiconductor memory according to claim 1 constituted of MOS transistors.

15. An electronic circuit having a floating gate type nonvolatile semiconductor memory according to claim 1.

16. A semiconductor integrated circuit having a floating gate type nonvolatile semiconductor memory according to claim 1.

17. An electronic device having a floating gate type nonvolatile semiconductor memory according to claim 1.

18. A floating gate type nonvolatile semiconductor memory according to claim 1, formed on an SOI (silicon on insulator) substrate.

19. A nonvolatile semiconductor memory, comprising:

a first multiplexer and a second multiplexer each provided at one of the two ends of a bit line to control the voltage level at said bit line;

a memory cell array provided between said first multiplexer and said second multiplexer that includes a transistor having a gate connected to a word line intersecting said bit line, a drain electrode connected to a select line and a source electrode connected to said bit line; and a cell drain voltage source that applies a voltage to said select line.

20. An electronic device having mounted therein a floating gate type nonvolatile semiconductor memory according to claim 19.

* * * * *